United States Patent
Gektin et al.

(10) Patent No.: US 7,619,308 B1
(45) Date of Patent: Nov. 17, 2009

(54) MULTI-LID SEMICONDUCTOR PACKAGE

(75) Inventors: Vadim Gektin, San Jose, CA (US);
David W. Copeland, Mountain View, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 12/114,376

(22) Filed: May 2, 2008

(51) Int. Cl.
*H01L 23/12* (2006.01)
(52) U.S. Cl. .................. 257/704; 257/710; 257/723; 257/724; 257/711; 257/712; 257/E23.181
(58) Field of Classification Search .............. 257/704, 257/710, 924, 723, 724, E23.18–E23.193, 257/E21.5, E21.501, 711, 712
See application file for complete search history.

(56) References Cited

U.S. PATENT DOCUMENTS 6,248,959 B1 * 6/2001 Sylvester .................. 174/256

* cited by examiner

*Primary Examiner*—Jasmine J Clark
(74) *Attorney, Agent, or Firm*—Osha • Liang LLP

(57) ABSTRACT

A multi-lid semiconductor package includes one or more die disposed on a substrate, an interconnect disposed on the substrate, one or more die lids, a die thermal interface between the one or more die and the corresponding die lid or lids, one or more substrate lids, and a substrate interface between the substrate and the corresponding substrate lid or lids. The multi-lid semiconductor package may include one or more discrete surface mount components disposed on the substrate. The multi-lid semiconductor package may include a sealant between the one or more die lids and the one or more substrate lids and the substrate. The one or more die lids and the one or more substrate lids may differ in construction, design, placement, and/or thermal performance.

20 Claims, 3 Drawing Sheets

MULTI-LID SEMICONDUCTOR PACKAGE

BACKGROUND OF INVENTION

A conventional semiconductor device 105, as shown in FIG. 1, includes a die 110 encapsulated in a mechanical package that serves as the electrical and mechanical interface between the die 110 and a system 140 in which the semiconductor device 105 is intended to operate. Typically, the mechanical package includes a interconnect 115, substrate 120, thermal interface 125, and lid 130.

The die 110 is typically a flip-chip that is die-attached to the substrate 120 using surface mount technology ("SMT"). In addition, one or more discrete SMT components 135, such as decoupling capacitors, are also placed on the substrate 120 in the vicinity of the die 110. The interconnect 115 provides the electrical and mechanical interface between the substrate 120 and the system 140, typically a printed circuit board ("PCB"). Conventional interconnect technology includes Land Grid Array ("LGA"), Ball Grid Array ("BGA"), Pin Grid Array ("PGA") and other methods of interconnecting the substrate to the system. The lid 130 seals the die 110 and discrete SMT components 135 to the substrate 120 and protects them from contamination. The lid 130 may also act as a thermal conductor to dissipate heat generated by the operation of the semiconductor device 105 in system 140. The lid 130 is a single contiguous piece of metal that spans the substrate 120.

SUMMARY OF INVENTION

According to one aspect of one or more embodiments of the present invention, a multi-lid semiconductor package comprising: one or more die disposed on a substrate; an interconnect disposed on the substrate; one or more die lids; a die thermal interface between the one or more die and the corresponding die lid or lids; one or more substrate lids; and a substrate thermal interface between the substrate and the corresponding substrate lid or lids.

According to one aspect of one or more embodiments of the present invention, a system comprising a multi-lid semiconductor package, the multi-lid semiconductor package comprising: one or more die disposed on a substrate; an interconnect disposed on the substrate; one or more die lids; a die thermal interface between the one or more die and the corresponding die lid or lids; one or more substrate lids; and a substrate thermal interface between the substrate and the corresponding substrate lid or lids.

DETAILED DESCRIPTION

Figure 1:
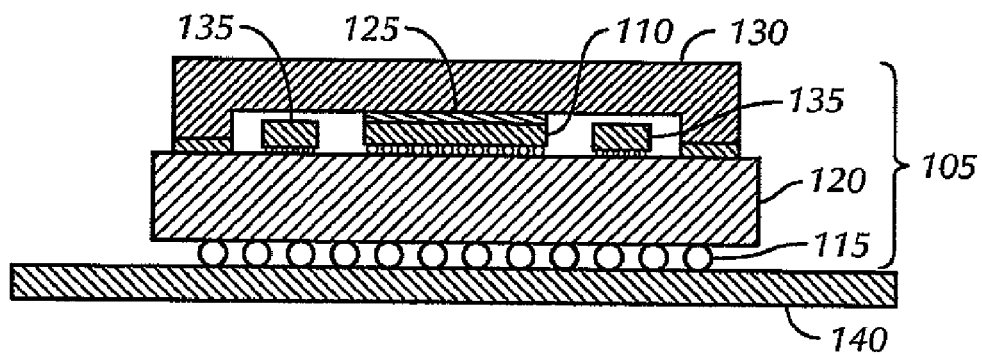
FIG. 1 is a cross-sectional view of a conventional semiconductor device.
Figure 2:
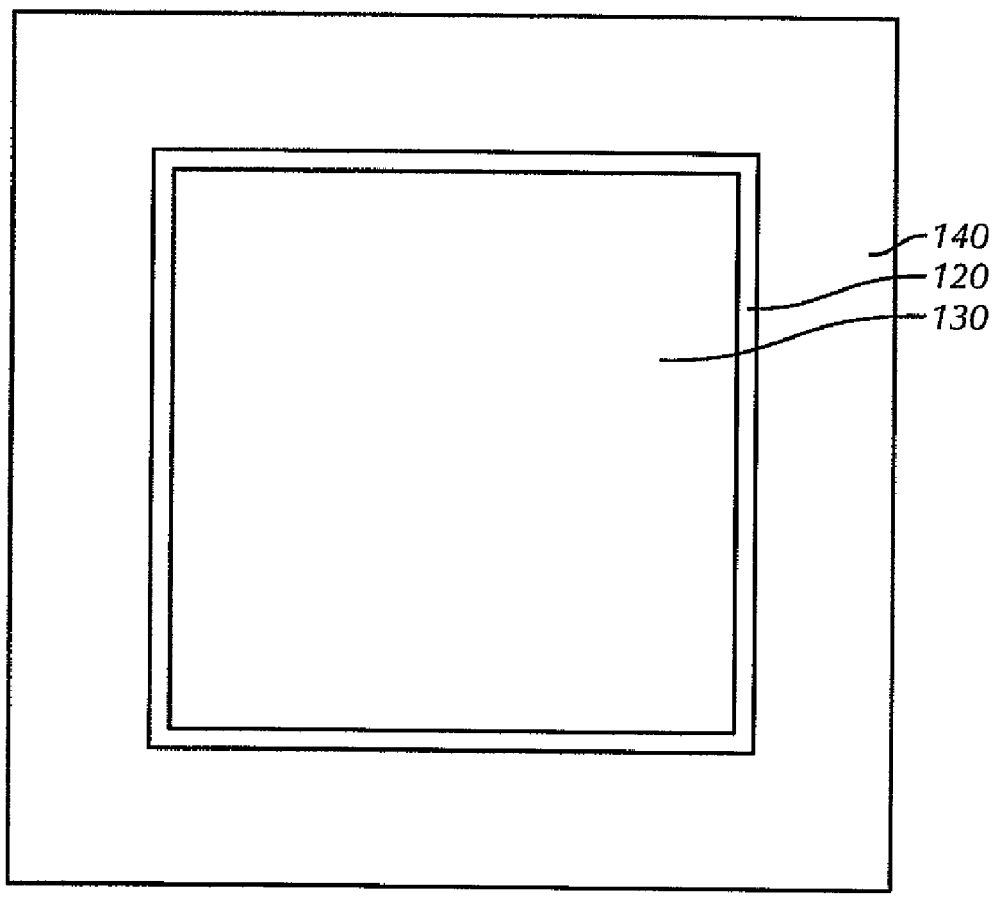
FIG. 2 is a top view of a conventional semiconductor device.

Specific embodiments of the present invention will now be described in detail with reference to the accompanying figures. Like elements in the various figures are denoted by like reference numerals for consistency. Further, in the following detailed description of embodiments of the present invention, numerous specific details are set forth in order to provide a more thorough understanding of the present invention. In other instances, well-known features have not been described in detail to avoid obscuring the description of embodiments of the present invention.

Figure 3:
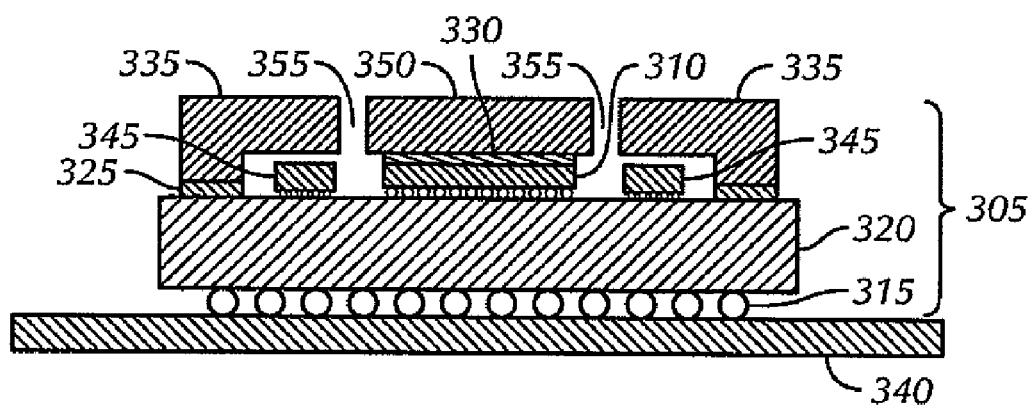
FIG. 3 is a cross-sectional view of a single die semiconductor device with a multi-lid package in accordance with one or more embodiments of the present invention.

FIG. 3 shows a cross-sectional view of a semiconductor device with a multi-lid package in accordance with one or more embodiments of the present invention. Semiconductor device 305 may include one or more die 310 disposed in a mechanical package that serves as the electrical and mechanical interface between the die 310 and a system 340 in which the semiconductor device 305 is intended to operate. The mechanical package includes a interconnect 315, substrate 320, structural interface 325, thermal interface 330, center lid 350, and exterior lid 335.

The die 310 are typically flip-chips that are die-attached to the substrate 320 using SMT. In addition, one or more discrete SMT components 345, such as decoupling capacitors, are also placed on the substrate 320 in the vicinity of the die 310. The interconnect 315 provides the electrical and mechanical interface between the substrate 320 and the system 340, typically a PCB. One of ordinary skill in the art will recognize that interconnect 315 may be an LGA, BGA, PGA, or other interconnect mechanism.

In one or more embodiments of the present invention, a semiconductor device 305 may have a single die 310 disposed in a mechanical package. Center lid 350 is attached to die 310 by thermal interface 330. Exterior lid 335 is attached to the substrate 320 by structural interface 325. One of ordinary skill in the art will recognize that structural interface 325 and thermal interface 330 may be formed by a variety of interface materials. Additionally, one of ordinary skill in the art will recognize that structural interface 325 and thermal interface 330 may differ in the interface materials used.

Center lid 350 and exterior lid 335 may be separated by space 355. The space 355 between the center lid 350 and exterior lid 335 may be sealed to prevent possible contamination. One of ordinary skill in the art will recognize that there are a variety of ways in which the space 355 may be sealed in accordance with one or more embodiments of the present invention.

Center lid 350 and exterior lid 335 may function without any mechanical connection between each other, allowing for the individualized and separate treatment of each lid. The elevation (z-dimensional rise from the horizontal seating plane of the substrate 320) of center lid 350 and exterior lid 335 may be different. The construction, design, placement, and thermal performance of center lid 350 and exterior lid 335 may be different. The center lid 350 may be made of highly conductive material, for example, aluminum, aluminum-silicon carbide, copper, copper-tungsten, silicon carbide, aluminum nitride, copper-diamond composite, silver-diamond composite, or silicon carbide-diamond composite. The exterior lid 335 may be made of the same material as that of center lid 350 or a wider range of materials, for example, stainless steel, plastic, or ceramic. One of ordinary skill in the art will recognize that center lid 350 and exterior lid 335 may be formed by a variety of materials in accordance with one or more embodiments of the present invention. One of ordinary skill in the art will recognize that the role of the center lid 350 and exterior lid 335 could be reversed in accordance with one or more embodiments of the present invention. As such, the exterior lid 335 could serve as the highly conductive lid and the center lid 350 could serve as the protective lid.

Figure 4:
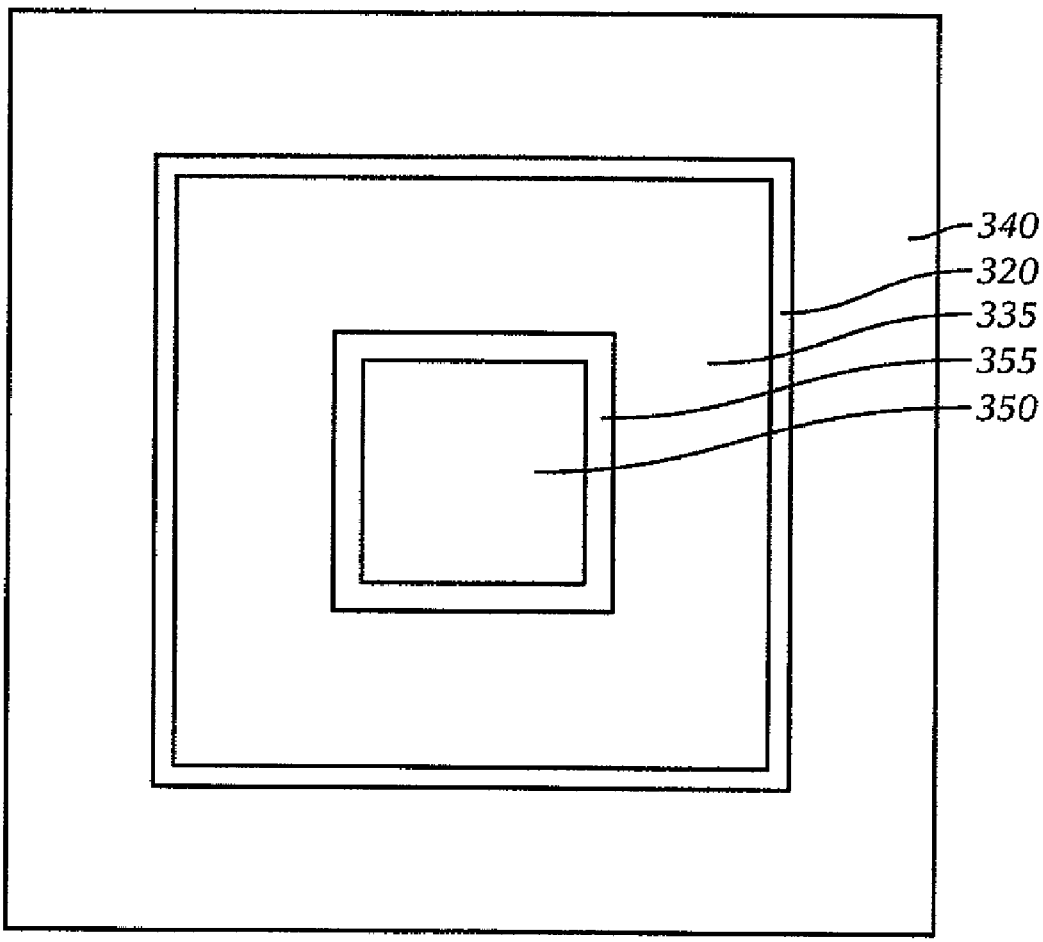
FIG. 4 is a top view of a single die semiconductor device with a multi-lid package in accordance with one or more embodiments of the present invention.

FIG. 4 shows a top view of a semiconductor device with a multi-lid package corresponding to the cross-sectional view shown in FIG. 3, in accordance with one or more embodiments of the present invention. The substrate 320 is attached to the PCB 340 by interconnect 315 (not shown). Exterior lid 335 is attached to the substrate 320 by structural interface 325 (not shown). Center lid 350 is attached to the die 310 (not shown) by thermal interface 330 (not shown). Center lid 350 and exterior lid 335 are separated by space 355. The space 355 between center lid 350 and exterior lid 335 may be sealed.

Figure 5:
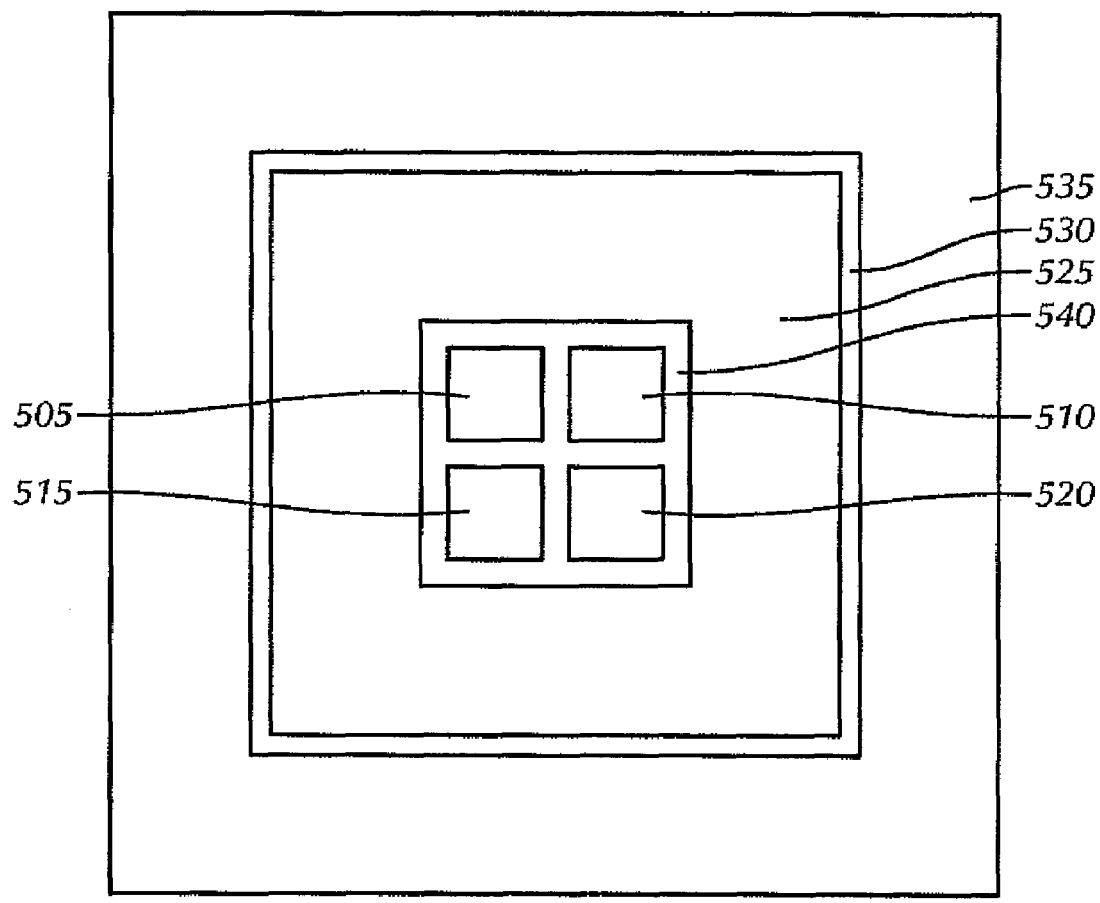
FIG. 5 is a top view of a multiple die semiconductor device with a multi-lid package in accordance with one or more embodiments of the present invention.

In one or more embodiments of the present invention, a semiconductor device may have multiple die disposed in a mechanical package. With reference to FIG. 5, a top view of a four-die semiconductor device with a multi-lid package in accordance with one or more embodiments of the present invention is shown.

The substrate 530 is attached to the PCB 535. Exterior lid 525 is attached to the substrate 530 by a structural interface (not shown). Center lid 505 is attached to a first die (not shown) by a thermal interface (not shown), center lid 510 is attached to a second die (not shown) by a thermal interface (not shown), center lid 515 is attached to a third die (not shown) by a thermal interface (not shown), and center lid 520 is attached to a fourth die (not shown) by a thermal interface (not shown). One of ordinary skill in the art will recognize that the thermal interfaces used to attach the center lids 505, 510, 515, and 520 to the respective die and the structural interface used to attach the exterior lid 525 to the substrate 530 may be formed by a variety of interface materials. Additionally, one of ordinary skill in the art will recognize that thermal interfaces and structural interface may differ in the interface materials used.

Center lids 505, 510, 515, 520, and exterior lid 525 are separated by space 540. The space 540 between center lids 505, 510, 515, 520, and exterior lid 525 may be sealed to prevent possible contamination. One of ordinary skill in the art will recognize that there are a variety of ways in which the space 540 may be sealed.

Center lids 505, 510, 515, 520, and exterior lid 525 may function without any mechanical connection between each other, allowing for individualized and separate treatment of each lid. The elevation (z-dimensional rise from the horizontal seating place of the substrate 530) of center lids 505, 510, 515, 520, and exterior lid 525 may be different from one another. The construction, design, placement, and thermal performance of center lids 505, 510, 515, 520, and exterior lid 525 may be different from one another.

One of ordinary skill in the art will recognize that the present invention contemplates other configurations of mechanical packages and lids in accordance with one or more embodiments of the present invention. Additionally, one of ordinary skill in the art will recognize that the present invention contemplates other configurations of die and discrete SMT components in accordance with one or more embodiments of the present invention.

Advantages of one or more embodiments of the present invention may include one or more of the following.

In one or more embodiments of the present invention, the multi-lid semiconductor package permits the use of different lid materials and different thermal interface materials for die having different power dissipation or temperature and reliability requirements.

In one or more embodiments of the present invention, the multi-lid semiconductor package provides for the minimization of lid material and thermal interface material.

In one or more embodiments of the present invention, the multi-lid semiconductor package provides for more precise control of the thickness of thermal interface material resulting in more precisely controlled thermal resistance.

In one or more embodiments of the present invention, the multi-lid semiconductor package provides for precise, individualized, and separate placement of lids in manner that is advantageous to that of a single contiguous lid.

In one or more embodiments of the present invention, the multi-lid semiconductor package allows for precise placement of a lid relative to a die.

In one or more embodiments of the present invention, the multi-lid semiconductor package tolerates variation in die height.

In one or more embodiments of the present invention, the multi-lid semiconductor package provides for precise, individualized, and separate means for heat dissipation.

In one or more embodiments of the present invention, the multi-lid semiconductor package can accommodate a package with one or more die that have different heights, warpage and planarity variation due to process variations, imperfections, residual stresses, and substrate warpage.

In one or more embodiments of the present invention, the multi-lid semiconductor package allows the use of a variety of materials with different tolerance requirements.

In one or more embodiments of the present invention, the multi-lid semiconductor package allows the use of a more advanced heat spreading material.

In one or more embodiments of the present invention, the multi-lid semiconductor package allows for the redistribution of the mechanical loading on the package and die.

In one or more embodiments of the present invention, the multi-lid semiconductor package simplifies the geometry involved in the mechanical design of the package.

While the invention has been described with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

What is claimed is:

1. A multi-lid semiconductor package comprising:
    one or more die disposed on a substrate;
    an interconnect disposed on the substrate;
    one or more die lids;
    a die thermal interface between the one or more die and the corresponding die lid or lids;
    one or more substrate lids; and
    a substrate interface between the substrate and the corresponding substrate lid or lids, wherein each of the one or more die lids is non-overlapping, in a plane view, with each of the one or more substrate lids.

2. The multi-lid semiconductor package of claim 1, the multi-lid semiconductor package further comprising one or more discrete surface mount components disposed on the substrate.

3. The multi-lid semiconductor package of claim 1, the multi-lid semiconductor package further comprising a sealant between the one or more die lids and the one or more substrate lids and the substrate.

4. The multi-lid semiconductor package of claim 1, the multi-lid semiconductor package further comprising at least one of different lid materials or different thermal interface materials for die having different power dissipation, temperature, or reliability requirements.

5. The multi-lid semiconductor package of claim 1, wherein the one or more die lids and the one or more substrate lids differ in at least one of construction, design, placement, or thermal performance.

6. The multi-lid semiconductor package of claim 1, wherein the one or more die lids are placed selectively across the multi-lid semiconductor package relative to the one or more die.

7. The multi-lid semiconductor package of claim 1, wherein a thickness of the die thermal interface is selectively controlled across the multi-lid semiconductor package.

8. The multi-lid semiconductor package of claim 1, wherein a elevation (z-dimensional rise from the horizontal seating plane of the substrate) of the one or more die lids are different from each another.

9. The multi-lid semiconductor package of claim 1, wherein a elevation (z-dimensional rise from the horizontal seating plane of the substrate) of the one or more substrate lids are different from each another.

10. The multi-lid semiconductor package of claim 1, wherein a elevation (z-dimensional rise from the horizontal seating plane of the substrate) of the one or more die lids and the one or more substrate lids are different from each another.

11. A system comprising a multi-lid semiconductor package, the multi-lid semiconductor package comprising:
  one or more die disposed on a substrate;
  an interconnect disposed on the substrate;
  one or more die lids;
  a die thermal interface between the one or more die and the corresponding die lid or lids;
  one or more substrate lids; and
  a substrate interface between the substrate and the corresponding substrate lid or lids, wherein each of the one or more die lids is non-overlapping, in a plane view, with each of the one or more substrate lids.

12. The system of claim 11, the multi-lid semiconductor package further comprising one or more discrete surface mount components disposed on the substrate.

13. The system of claim 11, the multi-lid semiconductor package further comprising a sealant between the one or more die lids and the one or more substrate lids and the substrate.

14. The system of claim 11, the multi-lid semiconductor package further comprising at least one of different lid materials or different thermal interface materials for die having different power dissipation, temperature, or reliability requirements.

15. The system of claim 11, wherein the one or more die lids and the one or more substrate lids differ in at least one of construction, design, placement, or thermal performance.

16. The system of claim 11, wherein the one or more die lids are placed selectively across the multi-lid semiconductor package relative to the one or more die.

17. The system of claim 11, wherein a thickness of the die thermal interface is selectively controlled across the multi-lid semiconductor package.

18. The system of claim 11, wherein a elevation (z-dimensional rise from the horizontal seating plane of the substrate) of the one or more die lids are different from each another.

19. The system of claim 11, wherein a elevation (z-dimensional rise from the horizontal seating plane of the substrate) of the one or more substrate lids are different from each another.

20. The system of claim 11, wherein a elevation (z-dimensional rise from the horizontal seating plane of the substrate) of the one or more die lids and the one or more substrate lids are different from each another.

* * * * *